United States Patent
Yi et al.

(10) Patent No.: US 12,299,222 B2
(45) Date of Patent: May 13, 2025

(54) MICRO LIGHT EMITTING DIODE TOUCH DISPLAY PANEL

(71) Applicant: Wuhan China Star Optoelectronics Semiconductor Display Technology Co., Ltd., Hubei (CN)

(72) Inventors: Shijuan Yi, Hubei (CN); Liang Sun, Hubei (CN)

(73) Assignee: Wuhan China Star Optoelectronics Semiconductor Display Technology Co., Ltd., Wuhan (CN)

(\*) Notice: Subject to any disclaimer, the term of this patent is extended or adjusted under 35 U.S.C. 154(b) by 0 days.

(21) Appl. No.: 17/623,700

(22) PCT Filed: Dec. 22, 2021

(86) PCT No.: PCT/CN2021/140367
§ 371 (c)(1),
(2) Date: Jun. 15, 2023

(87) PCT Pub. No.: WO2023/103091
PCT Pub. Date: Jun. 15, 2023

(65) Prior Publication Data
US 2024/0118757 A1  Apr. 11, 2024

(30) Foreign Application Priority Data
Dec. 11, 2021 (CN) .......................... 202111510958.1

(51) Int. Cl.
*G06F 3/041* (2006.01)
*G06F 3/044* (2006.01)
(Continued)

(52) U.S. Cl.
CPC ........ *G06F 3/0412* (2013.01); *G06F 3/04164* (2019.05); *G06F 3/04184* (2019.05);
(Continued)

(58) Field of Classification Search
None
See application file for complete search history.

(56) References Cited

U.S. PATENT DOCUMENTS

2019/0012957 A1\* 1/2019 Liu .................. G06F 1/1643

FOREIGN PATENT DOCUMENTS

| CN | 109213361 | 1/2019 |
| CN | 109782959 | 5/2019 |

(Continued)

OTHER PUBLICATIONS

International Search Report and the Written Opinion Dated Jul. 29, 2022 From the International Searching Authority Re. Application No. PCT/CN2021/140367 and Its Translation Into English. (20 Pages).

(Continued)

*Primary Examiner* — Brian M Butcher

(57) ABSTRACT

A micro light emitting diode touch display panel is provided with a pixel driving circuit, a power supply voltage signal line electrically connecting the pixel driving circuit, a first contact electrode electrically connecting the power supply voltage signal line, and a micro light emitting unit bonded to connect the first contact electrode. In a touch driving phase, the first contact electrode is re-used as a touch electrode, and the power supply voltage signal line is re-used as a touch signal line, thereby reducing the production costs, and promoting the production capacity as well as ensuring the touch control and display effects.

20 Claims, 5 Drawing Sheets

(51) Int. Cl.
*H01L 25/075* (2006.01)
*H01L 25/16* (2023.01)
*H01L 33/62* (2010.01)

(52) U.S. Cl.
CPC ........ *G06F 3/0446* (2019.05); *H01L 25/0753* (2013.01); *H01L 25/167* (2013.01); *H01L 33/62* (2013.01)

(56) References Cited

FOREIGN PATENT DOCUMENTS

| | | |
|---|---|---|
| CN | 109840033 | 6/2019 |
| CN | 110010021 | 7/2019 |
| CN | 111580702 | 8/2020 |
| CN | 111653212 | 9/2020 |
| CN | 111796712 | 10/2020 |
| CN | 111930259 | 11/2020 |
| KR | 10-2021-0057941 | 5/2021 |

OTHER PUBLICATIONS

Notification of Office Action and Search Report Dated Apr. 28, 2023 From the State Intellectual Property Office of the People's Republic of China Re. Application No. 202111510958.1 and Its Translation Into English. (38 Pages).

\* cited by examiner

MICRO LIGHT EMITTING DIODE TOUCH DISPLAY PANEL

RELATED APPLICATIONS

This application is a National Phase of PCT Patent Application No. PCT/CN2021/140367 having International filing date of Dec. 22, 2021, which claims the benefit of priority of Chinese Patent Application No. 202111510958.1 filed on Dec. 11, 2021. The contents of the above applications are all incorporated by reference as if fully set forth herein in their entirety.

FIELD AND BACKGROUND OF THE INVENTION

The present disclosure relates to a display technical field, and specifically, to a micro light emitting diode touch display panel.

A micro light emitting diode (Micro Light-Emitting Diode, Micro-LED) is composed of a micron-level semiconductor light-emitting unit array. It is a comprehensive technology combining new display technology and light-emitting diode (Light-Emitting Diode, LED) technology. With the advantages of self-luminescence, high efficiency, low power consumption, high integration, high stability, and all-weather work, it is considered to be one of the most promising next-generation new display and light-emitting devices. Because of its small size, high flexibility, easy disassembly and merging, Micro-LED can be used in any existing display applications ranging from the smallest to the largest size. In many cases, Micro-LED will be better than liquid crystal displays. Organic light-emitting diodes show more unique effects.

As the latest input device, the touch screen is currently the simplest and fastest way of human-computer interaction, and it is a very attractive and brand new multimedia interactive device. However, the currently known touch technology in organic light emitting diode displays is no longer suitable for Micro-LED displays. Additionally, if an external touch screen is used, it will also increase the cost, increase the thickness of the screen, and reduce the comfort of use.

In summary, there is an urgent need to provide a touch design solution for the Micro-LED touch screen.

SUMMARY OF THE INVENTION DISCLOSURE

Technical Problem

One embodiment of the present disclosure provides a micro light emitting diode touch display panel to solve the technical problem of the increase of the screen thickness and the production cost caused by deploying external touch screen in the existing Micro-LED touch display screen.

Technical Solutions

To solve the abovementioned problem, the present disclosure provides technical solutions as follows:

One embodiment of the present disclosure provides a micro light emitting diode touch display panel, including:
an array substrate, including a plurality of pixel driving circuits in
an array arrangement;
a plurality of power supply voltage signal lines disposed on the array substrate and electrically connected with the corresponding pixel driving circuits;
a plurality of first contact electrodes in an array arrangement,
disposed on the power supply voltage signal lines and electrically connected with the corresponding power supply voltage signal lines; and
a plurality of micro light emitting units in an array arrangement, including LED chips and first electrodes, wherein the first electrodes and the corresponding first contact electrodes are bonded to connect; wherein
in a display driving phase of the micro light emitting diode touch display panel, the power supply voltage signal lines transmit power supply voltage signals to the pixel driving circuits;
in a touch driving phase of the micro light emitting diode touch display panel, the first contact electrodes are re-used as touch electrodes, wherein the power supply voltage signal lines are re-used as touch signal lines for transmitting touch signals;
every few of the first contact electrodes are re-used as one of the touch electrodes, the few of the first contact electrodes are distributed along a first direction and a second direction, the first direction intersects with the second direction; the first contact electrodes arranged along the first direction contact to connect with each other, and the first contact electrodes arranged along the second direction are electrically connected to same one of the power supply voltage signal lines.

In at least one embodiment of the present disclosure, the micro light emitting diode touch display panel includes a display area and a bonding portion located outside the display area, the bonding portion electrically connects a driving chip, the driving chip time-sharing control a display drive and a touch drive of the micro light emitting diode touch display panel, the first contact electrodes are located at the display area, and a part of the power supply voltage signal lines electrically connects to the bonding portion.

In at least one embodiment of the present disclosure, the micro light emitting diode touch display panel includes a plurality of scan lines intersecting with a plurality of data lines, the scan lines and the data lines electrically connect with the pixel driving circuits, the micro light emitting diode touch display panel has a drive cycle including a first time period and a second time period that are set next to each other in a frame of a display screen;
during the first time period, the driving chip transmits a direct current potential signal to the power supply voltage signal lines, loads scan signals column by column to each of the scan lines, and loads data voltage signals to each row of the data lines;
during the second time period, the driving chip transmits a touch signal to the power supply voltage signal lines, each column of the scan lines and each row of the data lines are in a floating state; wherein the first time period and the second time period do not overlap, and a sum of the first time period and the second time period is equal to a frame of a display cycle.

In at least one embodiment of the present disclosure, the micro light emitting diode touch display panel includes a plurality of scan lines intersecting with a plurality of data lines, the scan lines and the data lines electrically connect with the pixel driving circuits, the micro light emitting diode touch display panel includes at least two first display intervals and at least two first touch intervals in a drive cycle of a frame of a display screen, and the first display intervals and the first touch intervals are alternately set in turn;
in the first display intervals, the driving chip transmits a direct current potential signal to the power supply voltage signal lines, loads scan signals column by column to a part of the scan lines, and loads data voltage signals to each row of the data lines;

in the first touch intervals, the driving chip transmits a touch signal to the power supply voltage signal lines, each column of the scan lines and each row of the data lines are in a floating state; wherein the first display intervals and the first touch intervals do not overlap, and a sum of the at least two first display intervals and the at least two first touch intervals is equal to a drive cycle in a frame of a display screen.

In at least one embodiment of the present disclosure, the power supply voltage signal lines include a first power signal line for transmitting a direct current high potential signal in a display phase, and a second power signal line for transmitting a direct current low potential signal in the display phase, wherein at least one of the first power signal line and the second power signal line is re-used as the touch signal line.

In at least one embodiment of the present disclosure, any adjacent touch electrodes are insulated from each other, at least one of the few of the power supply voltage signal lines which is correspondingly electrically connected with one of the touch electrodes is electrically connected with the bonding portion.

One embodiment of the present disclosure further provides another one of micro light emitting diode touch display panel, including:

an array substrate including a plurality of pixel driving circuits in an array arrangement;

a plurality of power supply voltage signal lines disposed on the array substrate and electrically connected with the corresponding pixel driving circuits;

a plurality of first contact electrodes in an array arrangement, disposed on the power supply voltage signal lines, and electrically connected with the corresponding power supply voltage signal lines; and a plurality of micro light emitting units in an array arrangement, the micro light emitting units include first electrodes, wherein the first electrodes and the corresponding first contact electrodes are bonded to connect; wherein in a display driving phase of the micro light emitting diode touch display panel, the power supply voltage signal lines transmit power supply voltage signals to the pixel driving circuits;

in a touch driving phase of the micro light emitting diode touch display panel, the first contact electrodes are re-used as touch electrodes, wherein the power supply voltage signal lines are re-used as touch signal lines for transmitting touch signals.

In at least one embodiment of the present disclosure, every few of the first contact electrodes are re-used as one of the touch electrodes, the few of the first contact electrodes are distributed along a first direction and a second direction, the first direction intersects with the second direction; wherein the first contact electrodes arranged along the first direction contact to connect with each other, and the first contact electrodes arranged along the second direction are electrically connected to same one of the power supply voltage signal lines.

In at least one embodiment of the present disclosure, the micro light emitting diode touch display panel includes a display area and a bonding portion located outside the display area, the bonding portion electrically connects a driving chip, the driving chip time-sharing control a display drive and a touch drive of the micro light emitting diode touch display panel, the first contact electrodes are located at the display area, and a part of the power supply voltage signal lines electrically connects to the bonding portion.

In at least one embodiment of the present disclosure, the micro light emitting diode touch display panel includes a plurality of scan lines intersecting with a plurality of data lines, the scan lines and the data lines electrically connect with the pixel driving circuits, the micro light emitting diode touch display panel has a drive cycle including a first time period and a second time period that are set next to each other in a frame of a display screen;

during the first time period, the driving chip transmits a direct current potential signal to the power supply voltage signal lines, loads scan signals column by column to each of the scan lines, and loads data voltage signals to each row of the data lines;

during the second time period, the driving chip transmits a touch signal to the power supply voltage signal lines, each column of the scan lines and each row of the data lines are in a floating state; wherein the first time period and the second time period do not overlap, and a sum of the first time period and the second time period is equal to a frame of a display cycle.

In at least one embodiment of the present disclosure, the micro light emitting diode touch display panel includes a plurality of scan lines intersecting with a plurality of data lines, the scan lines and the data lines electrically connect with the pixel driving circuits, the micro light emitting diode touch display panel includes at least two first display intervals and at least two first touch intervals in a drive cycle of a frame of a display screen, and the first display intervals and the first touch intervals are alternately set in turn;

in the first display intervals, the driving chip transmits a direct current potential signal to the power supply voltage signal lines, loads scan signals column by column to a part of the scan lines, loads data voltage signals to each row of the data lines;

in the first touch intervals, the driving chip transmits a touch signal to the power supply voltage signal lines, each column of the scan lines and each row of the data lines are in a floating state; wherein the first display intervals and the first touch intervals do not overlap, and a sum of the at least two first display intervals and the at least two first touch intervals is equal to a drive cycle in a frame of a display screen.

In at least one embodiment of the present disclosure, the power supply voltage signal lines include a first power signal line for transmitting a direct current high potential signal in a display phase, and a second power signal line for transmitting a direct current low potential signal in the display phase, wherein at least one of the first power signal line and the second power signal line is re-used as the touch signal line.

In at least one embodiment of the present disclosure, the second power signal line is re-used as the touch signal line.

In at least one embodiment of the present disclosure, any adjacent touch electrodes are insulated from each other, at least one of the few of the power supply voltage signal lines which is correspondingly electrically connected with one of the touch electrodes is electrically connected with the bonding portion.

In at least one embodiment of the present disclosure, the first contact electrodes include:

a plurality of first touch electrodes distributed in a form of an array, arranged along the first direction and in multiple columns, wherein the first touch electrodes in each column are electrically connected with each other; and a plurality of second touch electrodes distributed in a form of an array and insulated from the first touch electrodes, arranged along the second direction and in multiple rows, and the second touch electrodes in each row are electrically connected with each other.

In at least one embodiment of the present disclosure, the micro light emitting diode touch display panel further includes a plurality of first bridge lines electrically connected with adjacent two of the second touch electrodes in the same row, wherein adjacent two of the first touch electrodes in the same column are electrically connected through the corresponding first contact electrodes; the first touch electrodes and the second touch electrodes are disposed on same layer, and the first touch electrodes and the first bridge lines are disposed on different layers.

In at least one embodiment of the present disclosure, the first touch electrodes in one column or the second touch electrodes in one row are electrically connected to the bonding portion through the same one of the power supply voltage signal lines.

In at least one embodiment of the present disclosure, a first insulating layer is disposed between the first contact electrodes and the power supply voltage signal lines, the first insulating layer includes a first contact hole, wherein the first contact electrode is electrically connected with the corresponding power supply voltage signal line through the first contact hole.

In at least one embodiment of the present disclosure, the micro light emitting diode touch display panel further includes a plurality of second contact electrodes distributed in a form of an array, the second contact electrodes and the first contact electrodes are disposed on the same layer, a second insulating layer is disposed on the first contact electrodes and the second contact electrodes, the second insulating layer includes a plurality of second contact holes and a plurality of third contact holes, the first electrodes are electrically connected with the first contact electrodes through the second contact holes, the micro light emitting unit further includes second electrodes electrically connected with the second contact electrodes through the third contact holes.

In at least one embodiment of the present disclosure, the second contact electrodes are arranged along the first direction and the second direction, and the second contact electrodes and the first contact electrodes are distributed in a form of alternate columns.

Beneficial Effect

One embodiment of the present disclosure provides a micro light emitting diode touch display panel, including a plurality of pixel driving circuits, a plurality of power supply voltage signal lines, a plurality of first contact electrodes, and a plurality of micro light emitting units arranged in an array. The power supply voltage signal lines and the pixel driving circuit electrically connect the first contact electrodes, the micro light emitting units are bonded to connect the first contact electrodes. In a display driving phase, the power supply voltage signal lines transmit power supply voltage signals to the pixel driving circuits; in a touch driving phase, the first contact electrodes are re-used as a touch electrode, the power supply voltage signal lines are re-used as touch signal lines for transmitting touch signals. In this way, the production costs can be reduced, and the production capacity can be promoted as well as ensuring good touch and display effects.

DETAILED DESCRIPTION OF SPECIFIC PREFERRED EMBODIMENTS OF THE INVENTION

The technical solutions in embodiments of the present disclosure will be described clearly and completely in conjunction with the drawings in the embodiments of the present disclosure. Apparently, the described embodiments are only a part of the embodiments of the present disclosure, but not all the embodiments. Based on the embodiments in the present disclosure, other embodiments obtained by those skilled in the art without creative work would fall within the protection scope of the present disclosure.

In the description of the present disclosure, it should be understood that the terms "first" and "second" are used for description only, and cannot be understood as indicating or implying relative importance, or the number of technical features indicated. Thus, features defined as "first" and "second" may explicitly or implicitly include one or more of the features. In the description of the present disclosure, "multiple" means two or more than two, unless it is specifically defined. In this application, unless expressly defined and limited, otherwise, a first feature "on" or "under" a second feature may include direct contact between the first and second features; or include that the first and second features do not directly contact with each other but contact indirectly through another feature between them. Additionally, the first feature "on" the second feature means that the first feature is directly above and obliquely above the second feature, or it merely means that the first feature is higher than the second feature.

Figure 1:
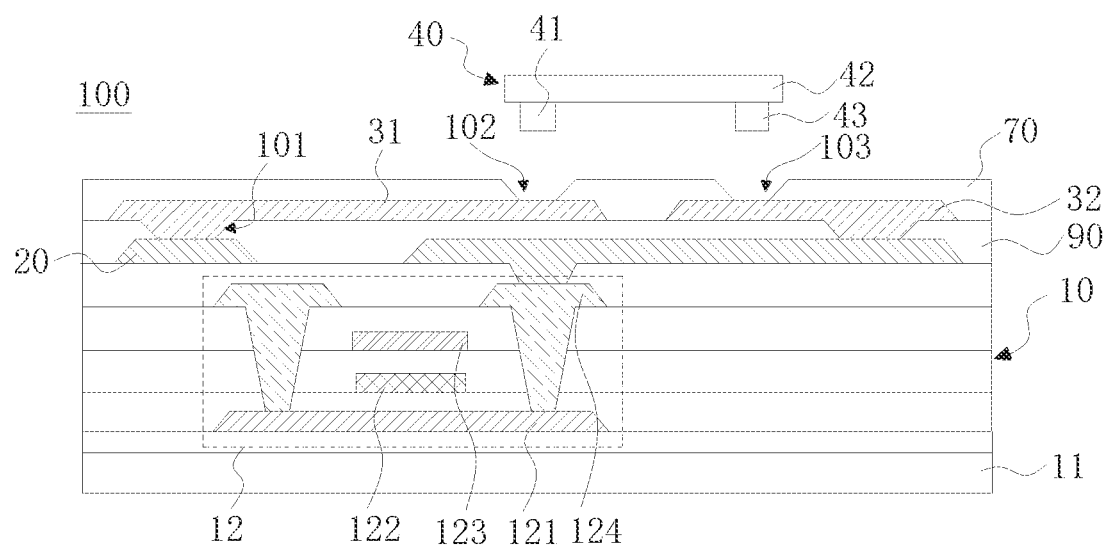
FIG. 1 is a film stack structure diagram of a micro light emitting diode touch display panel provided by one embodiment of the present disclosure.

Referring to FIG. 1, one embodiment of the present disclosure provides a micro light emitting diode touch display panel 100. The micro light emitting diode touch display panel 100 includes an array substrate 10, a plurality of power supply voltage signal lines 20 disposed on the array substrate 10, a plurality of first contact electrodes 31 and a plurality of second contact electrodes 32 disposed on the power supply voltage signal lines 20, and a plurality of micro light emitting units 40 distributed in a form of an array. It is characterized that the array substrate 10 includes a plurality of pixel driving circuits 12 disposed in an array arrangement. The pixel driving circuits 12 are used for driving the micro light emitting units 40 to emit light. The power supply voltage signal lines 20 and the corresponding pixel driving circuits 12 are electrically connected. The first contact electrodes 31 and the corresponding power supply voltage signal lines 20 are electrically connected. The micro light emitting units 40 include first electrodes 41 and second electrodes 43. The first electrodes 41 and the corresponding first contact electrodes 31 are bonded to connect. The second electrodes 43 and the corresponding second contact electrodes 32 are bonded to connect. The first electrodes 41 are one of N electrode (cathode) and P electrode (anode). The second electrodes 43 are another one of the N electrode and P electrode. The micro light emitting units 40 are connected by bonding with the corresponding first contact electrodes 31 and the second contact electrodes 32 to realize the electrical connection with the pixel driving circuits 12.

It should be understood that an insulating layer is disposed between the adjacent film layers such as the pixel driving circuits 12, the power supply voltage signal lines 20, the first contact electrodes 31, and the micro light emitting units 40 to isolate them from each other.

A first insulating layer 90 is disposed between the first contact electrodes 31 and the power supply voltage signal lines 20. The first insulating layer 90 includes first contact holes 101. The first contact electrodes 31 electrically connect the corresponding power supply voltage signal lines 20 through the first contact holes 101.

The second contact electrodes 32 and the first contact electrodes 31 are disposed at same layer. A second insulating layer 70 is disposed on the first contact electrodes 31 and the second contact electrodes 32 to protect the first contact electrodes 31, the second contact electrodes 32, and metal devices under them. The second insulating layer 70 includes a plurality of second contact holes 102 and a plurality of third contact holes 103. The second contact holes 102 expose a part of surface of the corresponding first contact electrodes 31. The third contact holes 103 expose a part of surface of the corresponding second contact electrodes 32. The first electrodes 41 electrically connect the first contact electrodes 31 through the second contact holes 102. The second electrodes 43 electrically connect the second contact electrodes 32 through the third contact holes 103.

In one embodiment of the present disclosure, each of the micro light emitting units 40 includes at least one micro light emitting diode (Micro LED). Specifically, the micro light emitting units 40 include Micro LED chips 42, and the first electrodes 41 and the second electrodes 43 protruding from the Micro LED chips 42.

Figure 3:
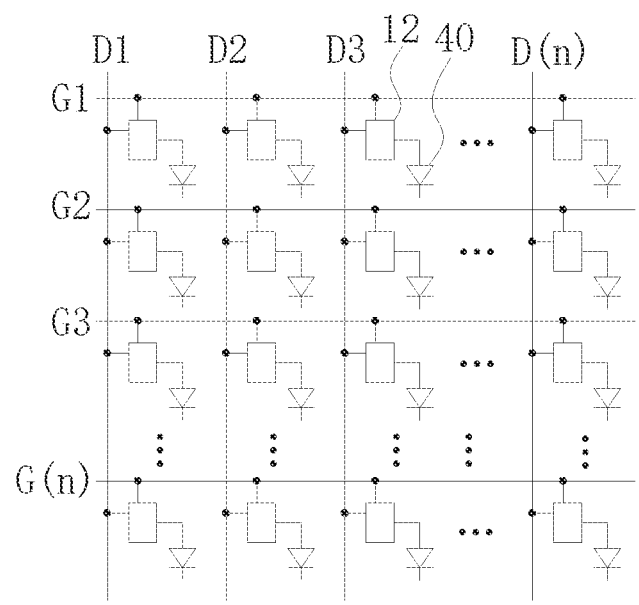
FIG. 3 is a schematic plan view of a micro light emitting diode touch display panel provided by one embodiment of the present disclosure.

In one embodiment of the present disclosure, the power supply voltage signal lines 20 include first power signal lines and second power signal lines. When the pixel driving circuits 12 drive to display (i.e. display phase), the first power signal lines are used for transmitting direct current high potential signals. The second power signal lines are used for transmitting direct current low potential signals. Specifically, the first power signal lines may transmit power positive voltage signals VDD. The second power signal lines may transmit power negative voltage signals VSS or initialization voltage signals Vi. Referring to FIG. 3, the micro light emitting diode touch display panel 100 includes a plurality of scan lines G1~G(n) and a plurality of data lines D1~D(n). The scan lines G1~G(n) and the data lines G1~G(n) intersect to define a plurality of pixel regions. The pixel driving circuit 12 and the micro light emitting unit 40 are located at the corresponding pixel regions. The scan lines G(n) transmit scan signals Scan(n) to the pixel driving circuit 12. The data lines D(n) transmit data voltage signals Data to the pixel driving circuit 12.

Figure 4:
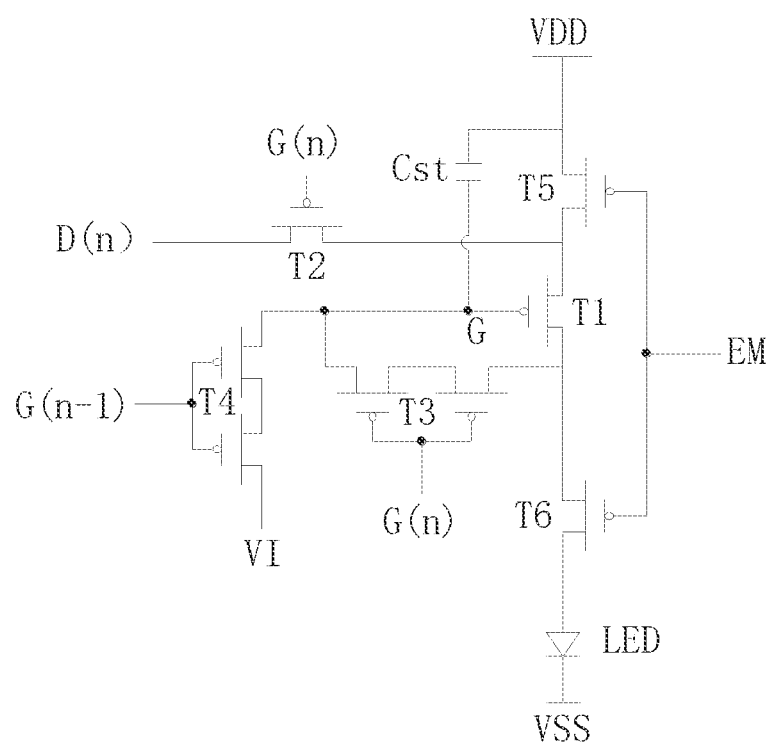
FIG. 4 is a schematic view showing a circuit principle of a pixel driving circuit provided by one embodiment of the present disclosure.

Referring to FIG. 4, which is a principle diagram of a pixel driving circuit 12 provided by one embodiment of the present disclosure. The pixel driving circuit 12 may be 2T1C (two transistors and one storage capacitor), 6T1C (six transistors and one storage capacitor), or 7T1C (seven transistors and one storage capacitor). One embodiment of the present disclosure is described by an example of the 6T1C circuit. The pixel driving circuit 12 includes a first transistor T1, a second transistor T2, a third transistor T3, a fourth transistor T4, a fifth transistor T5, and a sixth transistor T6. The first transistor T1 is a drive transistor. The second transistor T2 is a switching transistor. The third transistor T3 is a compensating transistor. The fourth transistor T4 is an initialization transistor. The fifth transistor T5 is a first light emitting control transistor, and the sixth transistor T6 is a second light emitting control transistor.

Specifically, the second transistor T2 has a gate electrode electrically connecting the $n^{th}$ level scan signal lines G(n), a drain electrode electrically connecting data lines D(n), and a source electrode electrically connecting a drain electrode of the fifth transistor T5. The fifth transistor T5 has a gate electrode electrically connecting light emitting signal lines EM. The fifth transistor T5 has a source electrode electrically connecting a power signal line which is used for transmitting power positive voltage signals VDD. The fourth transistor T4 has a gate electrode electrically connecting the $(n-1)^{th}$ level scan signal lines G(n-1). The fourth transistor T4 has a source electrode electrically connecting initialization signal lines for transmitting initialization signals Vi. The fourth transistor T4 has a drain electrode electrically connecting a gate electrode of the first transistor. The sixth transistor T6 has a gate electrode electrically connecting light emitting control signal lines EM. The sixth transistor T6 has a source electrode electrically connecting a drain electrode of the first transistor T1 and a drain electrode of the third transistor T3. The sixth transistor T6 has a drain electrode electrically connecting an anode (P node) of the corresponding micro light emitting unit 40. The micro light emitting unit 40 has an cathode (N node) electrically connecting the power signal line for transmitting the power negative voltage signals VSS. The third transistor T3 has a gate electrode electrically connecting the $n^{th}$ level scan signal lines G(n). the third transistor T3 has a source electrode electrically connecting a gate electrode of the first transistor T1. The gate electrode of the first transistor T1 also act as an electrode plate of a storage capacitor Cst. The storage capacitor Cst has another electrode plate electrically connecting a source electrode of the fifth transistor.

The abovementioned transistors T1-T6 may be P-type transistors, but they may also be N-type transistors in other embodiments. The third transistor T3 and the fourth transistor T4 may be double-gate transistors.

The drive display phase of the pixel driving circuit 12 includes three process including reset, compensation, and light up. Reset process: when scan lines scan(n−1) are at low level, the fourth transistor T4 is turned on and the initialization signals is input to reset the gate electrode of the first transistor T1 (the G point in FIG. 4), and the storage capacitor Cst discharges; compensation process: the scan lines scan(n) change to a low level, the second transistor T2, the third transistor T3, the first transistor T1 are turned on, the data voltage signals are input and the voltage of G point changes to Vdata+Vth (Vdata is the data voltage input by the data lines, Vth is a threshold voltage), the capacitor Cst charges to realize data signal input and Vth compensation; light up phase: the light emitting control signal lines EM change to low level, the fifth transistor T5 and the sixth transistor T6 are turned on, the first power signal lines input the direct current high potential signal to provide power and the Micro LED emits light continuously.

In a current micro LED touch display panel, an external touch structure is generally deployed. That is, a touch substrate and a display substrate are separately prepared from two pieces of substrate, and then they are bonding together. The external touch display panel increases a thickness of the screen and production costs. An embedded touch structure has touch layers integrated into a display substrate, although the screen thickness may be decreased to a certain extent, the touch signal lines are designed by using a single metal layer that increases the manufacturing process of the array and production duration of the display substrate, resulting in the reduction of the production capacity. The present disclosure provides improvements of the touch structure for the existing defects of the current micro LED touch display panel, including the reuse of the power supply voltage signal lines 20 on the array substrate 10 as touch signal lines, thereby reducing production costs and promoting production capacity without adding a new manufacturing process.

Specifically, in the display driving phase of the micro light emitting diode touch display panel 100, the power supply voltage signal lines 20 transmit the power supply voltage signal to the pixel driving circuit 12; in the touch driving phase of the micro light emitting diode touch display panel 100, the first contact electrodes 31 are distributed in an array, and the first contact electrodes 31 are re-used as the touch electrodes 80. The power supply voltage signal lines 20 are re-used as the touch signal lines to transmit the touch signal. In this way, the touch function of the micro LED touch display panel can be achieved without adding new film layers, thereby greatly saving the process and increasing the production capacity.

Figure 2:
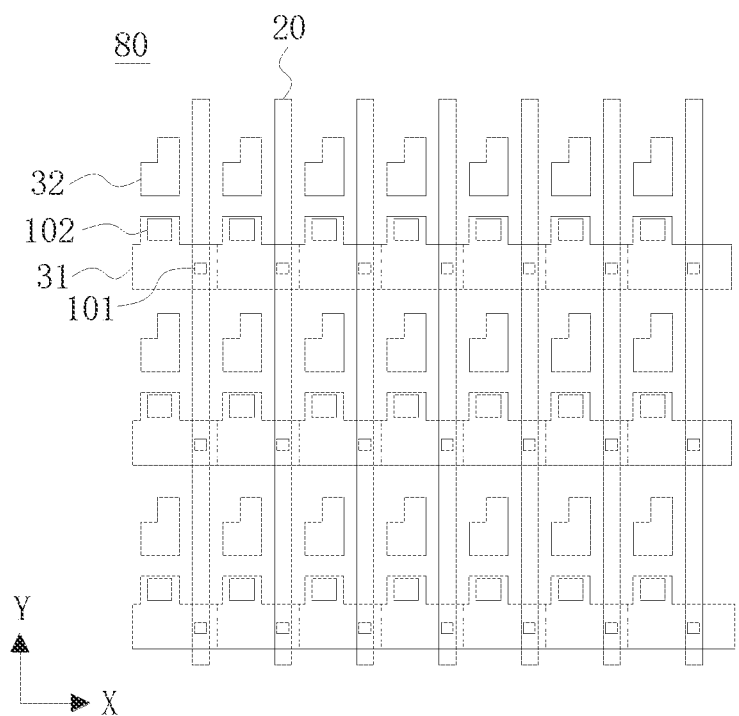
FIG. 2 is a structural schematic view of a touch electrode provided by one embodiment of the present disclosure.

Referring to FIG. 2, since the micro LED chip has a smaller size as being several microns, the size of the touch electrode is 3-5 millimeters, and thus the size of one first contact electrode 31 is not sufficient to meet the requirement of precise control of the touch electrode 80. Therefore, in one embodiment of the present disclosure, few of the first contact electrodes 31 are deployed to reuse as one touch electrode 80. Specifically, every few of the first contact electrodes 31 are re-used as one of the touch electrodes 80. The few of the first contact electrodes 31 are distributed along a first direction X and a second direction Y. The first direction X intersects with the second direction Y. It is characterized that the first contact electrodes 31 arranged along the first direction X are connected and in contact with each other, i.e. the first contact electrodes 31 in the same column are connected with each other. The first contact electrodes 31 arranged along the second direction Y are all electrically connected to the same one of the power supply voltage signal lines 20, i.e. one of the power supply voltage signal lines 20 electrically connects the power supply voltage signal lines 20 in the same row. By this design, it can not only make several first contact electrodes 31 communicate with each other and be re-used as one touch electrode 80, but also realize the power supply voltage signal lines 20 to transmit the power supply voltage signal to the pixel driving circuit 12 corresponding to each micro light emitting unit 40.

It can be understood that the number of the first contact electrodes 31 re-used for one of the touch electrodes 80 depends on the actual size of the micro light emitting unit 40 and the distance between the micro light emitting units 40.

The second contact electrodes 32 are arranged along the first direction X and the second direction Y. The second contact electrodes 32 and the first contact electrodes 31 are distributed in a form of alternate columns. The number of the second contact electrodes 32 may be equal to the number of the first contact electrodes 31.

In one embodiment of the present disclosure, in one touch electrode 80, the first contact electrodes 31 in one column are connected and arranged in a form of a strip electrode. The power supply voltage signal lines 20 are arranged along the first direction X and extending along the second direction Y. The power supply voltage signal lines 20 intersect with the strip electrode to form a metal mesh pattern and thus the pattern of the touch electrode 80 may be seen as a metal mesh pattern.

Figure 5:
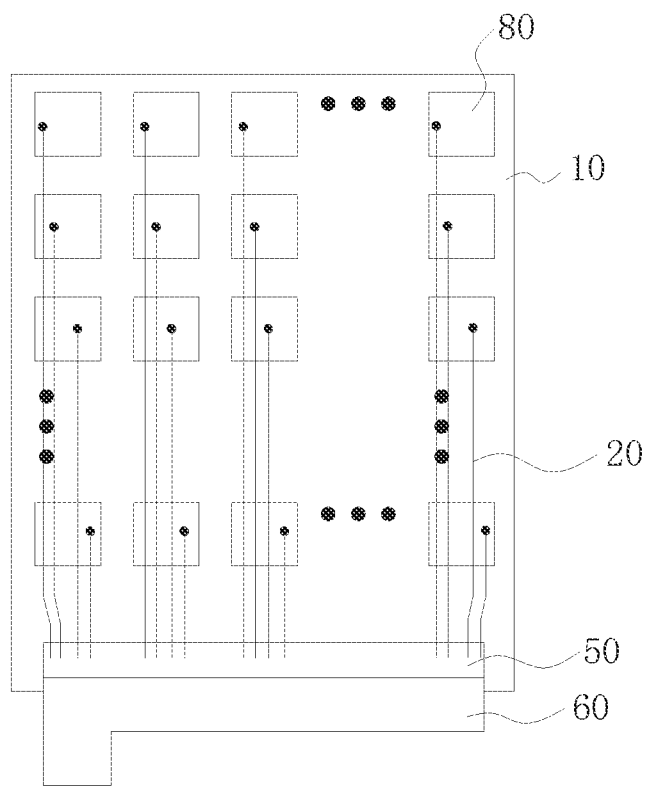
FIG. 5 is a structural schematic view of a plurality of first contact electrodes and a plurality of power supply voltage signal lines provided by one embodiment of the present disclosure.

Referring to FIG. 5, the micro light emitting diode touch display panel 100 includes a display area and a bonding portion 50 outside the display area. The bonding portion 50 electrically connects a driving chip (not shown). The first contact electrodes 31 are located at the display area, a part of the power supply voltage signal lines 20 electrically connects the bonding portion 50. Specifically, the bonding portion 50 electrically connects a flexible circuit board 60, and the driving chip electrically connects the flexible circuit board 60.

The driving chip may be a chip having an integrated function of touch control and display control, capable of time-sharing controlling the touch drive and the display drive of the micro light emitting diode touch display panel 100.

In some embodiment, a vertical time-sharing method (V blanking timing) may be deployed to perform the display drive and the touch drive, i.e. there are only one display time period and one touch time period in the drive cycle of one frame of screen. In the drive cycle of one frame of the display screen, the first contact electrodes 31 and the power supply voltage signal lines 20 transmit the power supply voltage signal for driving the pixel to display. After finishing the display drive of the pixels in all columns, during the remaining time of one frame of the drive cycle, the first contact electrodes 31 are re-used as a touch electrode 80, and the power supply voltage signal lines 20 are used as a touch signal line to complete the touch drive.

In other embodiments, a horizontal driving method (long H blanking timing) may be used for performing the display drive and the touch drive, i.e. there are at least two display time periods and at least two touch time periods in the drive cycle of one frame of a display screen. The display time period and the touch time period are set alternately. The first contact electrodes 31 and the power supply voltage signal lines 20 drive a part of the pixels to display. After completing a part of every frame of screen, transferring into the touch electrodes 80 and the touch signal lines and then performing the touch drive in the next part of the frame of screen. When completing the first display time period and the first touch time period, entering the second display time period and the second touch time period in turn to use this cycle to finish the drive cycle of the frame. Each drive cycle is set to at least two display time periods and at least two touch time periods that is arranged alternately, thereby further enhancing the sensing precise of the first contact electrodes 31 as being the touch electrode 80.

It is characterized that the display time period may be equal to the touch time period. In other embodiment, the display time period may be different from the touch time period.

Figure 6:
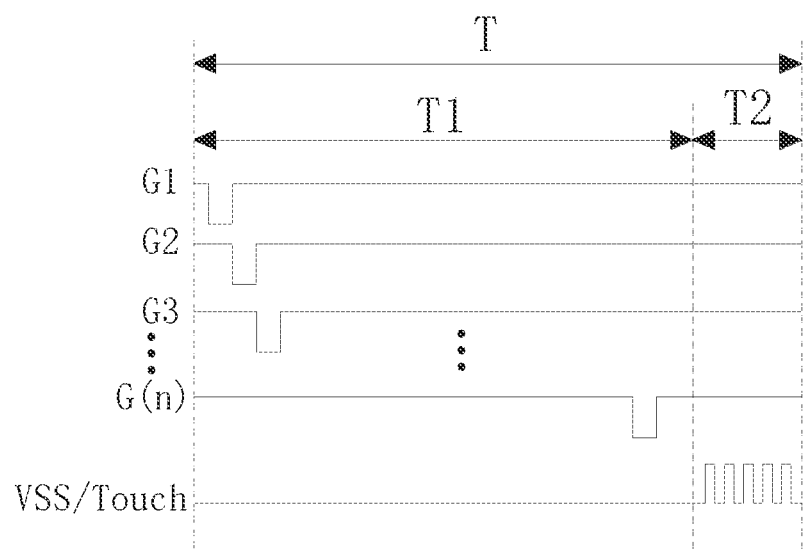
FIG. 6 is a timing diagram of a drive cycle in a frame of a display screen provided by one embodiment of the present disclosure.

Specifically, referring to FIG. 6, which is a timing diagram of a drive cycle of one frame of screen in a vertical time-sharing method. In some embodiment of the present disclosure, the drive cycle T of the micro light emitting diode touch display panel 100 in a frame of a display screen includes a first time period T1 and a second time period T2 that is set next to each other. In the first time period T1, the driving chip transmits a direct current potential signal to the power supply voltage signal line 20, loads scan signals column by column to each of the scan lines, and loads data voltage signals to each row of the data lines. In the second time period T2, the driving chip transmits a touch signal to the power supply voltage signal lines, each column of the scan lines G(n) and each row of the data lines D(n) are in a floating state; wherein the first time period T1 and the second time period T2 do not overlap, and a sum of the first time period T1 and the second time period T2 is equal to a frame of a display cycle T, i.e. T=T1+T2.

Figure 7:
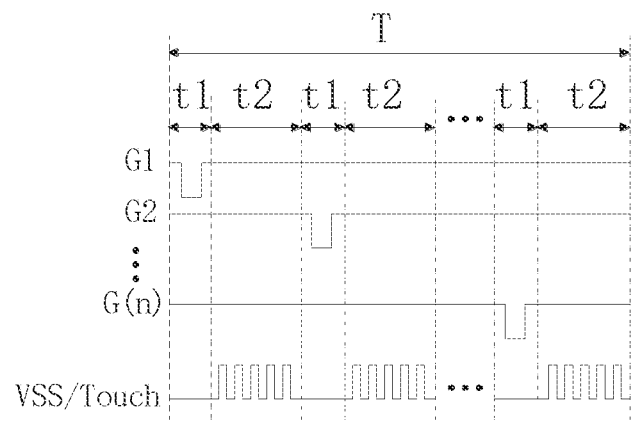
FIG. 7 is a timing diagram of a drive cycle in a frame of a display screen provided by another embodiment of the present disclosure.
Figure 8:
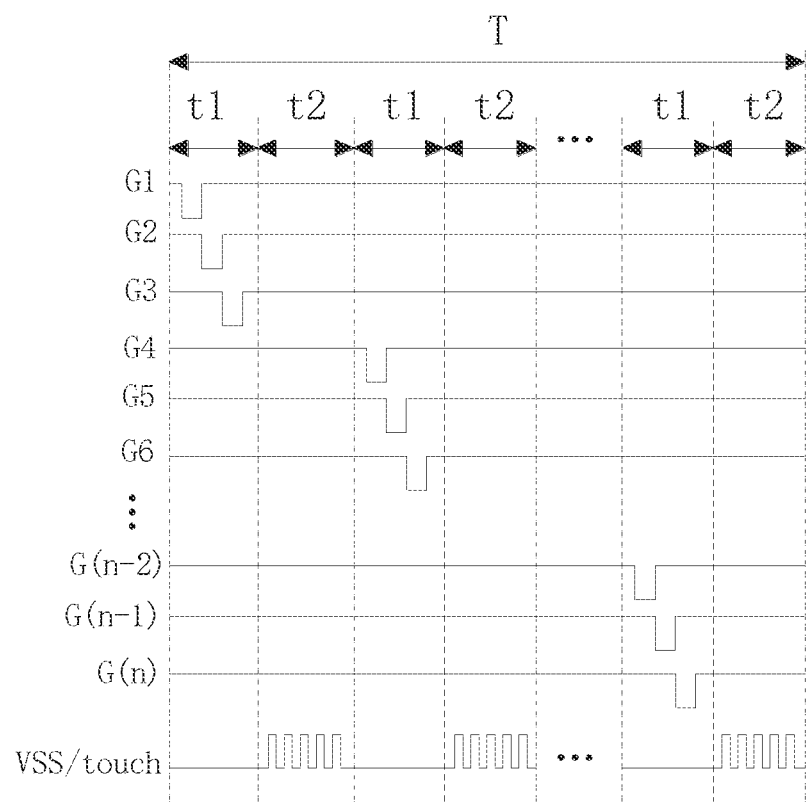
FIG. 8 is a timing diagram of a drive cycle in a frame of a display screen provided by a further embodiment of the present disclosure.

Referring to FIG. 7 and FIG. 8, which are a part of the timing diagram of a drive cycle of a frame of screen in a horizontal driving method according to different embodiments of the present disclosure. In some embodiments of the present disclosure, the drive cycle T of the micro light emitting diode touch display panel 100 in a frame of the display screen includes at least two first display intervals t1 and at least two first touch intervals t2. The first display intervals t1 and the first touch intervals t2 are alternately set in turn. In the first display intervals t1, the driving chip transmits a direct current potential signal to the power supply voltage signal lines 20, loads scan signals column by column to a part of the scan lines, and loads data voltage signals to each row of the data lines. In the first touch intervals t2, the driving chip transmits a touch signal to the power supply voltage signal lines 20, the first contact electrodes 31 are re-used as a touch electrode to sense changes of the touch capacitance, each column of the scan lines and each row of the data lines are in a floating state; wherein the first display intervals t1 and the first touch intervals t2 do not overlap, and a sum of the at least two first display intervals t1 and the at least two first touch intervals t2 is equal to a drive cycle T in a frame of a display screen.

As shown in FIG. 7, in a specific embodiment, in each first display intervals t1, only one row of pixels may be driven to display, and in the next first touch intervals t2, the touch drive is completed. The first display time interval t1 and the first touch time interval t2 are repeated until the display drive of all rows of pixels is completed.

As shown in FIG. 8, in other specific embodiments, in each one of the first display time intervals t1, three columns of pixels can be driven to display column by column, and in the next first touch interval t2, the touch drive is completed. The first display time interval t1 and the first touch time interval t2 are repeated until the display drive of all columns of the pixels is completed.

In some embodiments, at least one of the first power signal line and the second power signal line is re-used as the touch signal line. In a specific embodiment of the present disclosure, the second power signal line may be re-used as the touch signal line. Specifically, the power signal line for transmitting the power negative voltage signals VSS can be selected to use as the touch signal line. In the display phase, the second power signal line transmits the power negative voltage signals VSS. In the touch phase, the second power signal line transmits the touch signal Touch. The touch signal Touch may include pulse signals.

Referring to FIG. 2 and FIG. 5, in some embodiments of the present disclosure, the micro light emitting diode touch display panel 100 may be a self-capacitance touch display panel. A plurality of the first contact electrodes 31 are re-used as sensing electrodes. The pattern of the touch electrode 80 may be a square or rectangular pattern. Any adjacent touch electrodes 80 are insulated from each other. That is, the first contact electrodes 31 corresponding to the adjacent touch electrodes 80 are disconnected from each other. At least one of the few of the power supply voltage signal lines 20 which is correspondingly electrically connected with one of the touch electrodes 80 is electrically connected with the bonding portion 50. In one embodiment of the present disclosure, since the first contact electrodes 31 of each touch electrode 80 are communicated, and thus only one of the power supply voltage signal lines 20 is needed to be introduced from each touch electrode 80 to bond to the bonding portion 50, the power supply voltage signal can be transmitted to each pixel driving circuit 12.

Referring to FIG. 1, the micro light emitting diode touch display panel 100 includes a base 11, a buffer layer disposed on the base 11, a semiconductor layer disposed on the buffer layer, a first gate insulating layer disposed on the semiconductor layer, a first metal layer disposed on the first gate insulating layer, a second gate insulating layer disposed on the first metal layer, a second metal layer disposed on the second gate insulating layer, an interlayer dielectric layer disposed on the second metal layer, a third metal layer disposed on the Interlayer dielectric layer, a first planarization layer disposed on the third metal layer, a fourth metal layer disposed on the first planarization layer, a first insulating layer 90 disposed on the fourth metal layer, a fifth metal layer disposed on the first insulating layer 90, and a second insulating layer 70 disposed on the fifth metal layer. The first insulating layer 90 and the second insulating layer 70 may be planarization layers to play a role of insulation and flatness.

It is characterized that the semiconductor layer includes an active layer 121 for forming the transistors of the pixel driving circuits 12. The first metal layer includes a gate electrode 122 and scan lines for forming the transistors of the pixel driving circuits 12. The second metal layer includes one electrode plate 123 for forming the storage capacitor of the pixel driving circuits 12 and initialization signal lines for transmitting initialization signals Vi. The third metal layer includes a source drain layer 124 and data lines for forming the transistors of the pixel driving circuits 12. The fourth metal layer includes the power supply voltage signal lines 20, for example, a first power signal line and a second power signal line. The fifth metal layer includes the first contact electrodes 31 and the second contact electrodes 32.

Figure 9:
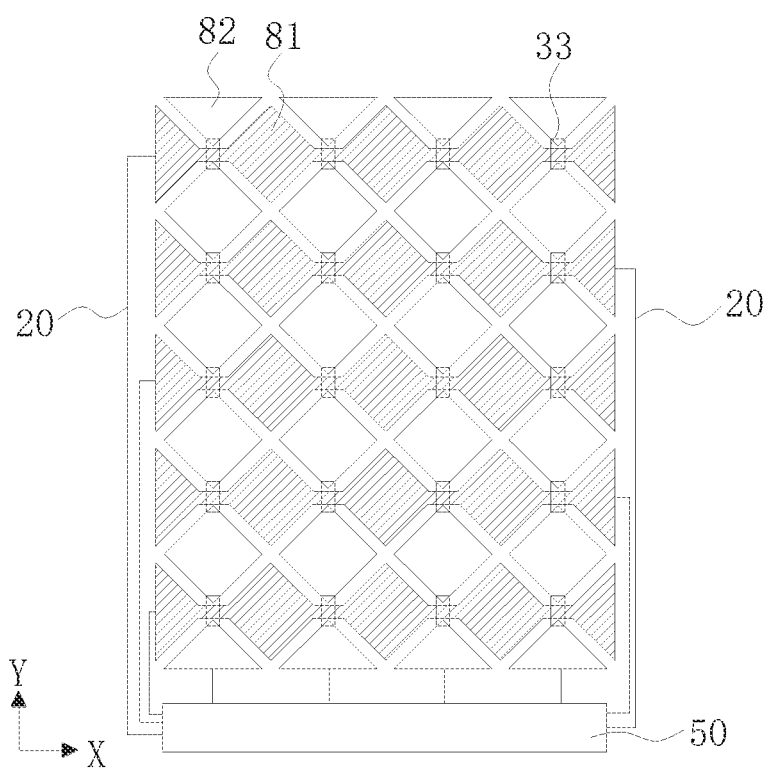
FIG. 9 is a structural schematic view of a plurality of first contact electrodes and a plurality of power supply voltage signal lines provided by another embodiment of the present disclosure.

In other embodiment, as shown in FIG. 9, the micro light emitting diode touch display panel 100 may be a mutual capacitance touch display panel. A plurality of first contact electrodes 31 includes a plurality of first touch electrodes 81 in an array arrangement and a plurality of second touch electrodes 82 in an array arrangement. The first touch electrodes 81 and the second touch electrodes 82 are insulated from each other. The first touch electrodes 81 are arranged along a first direction X and in multiple columns. The first touch electrodes 81 in each column are electrically connected with each other. The second touch electrodes 82 are arranged along a second direction Y and in multiple rows. The second touch electrodes 82 in each row are electrically connected with each other.

The first direction X may be a column direction. The second direction Y may be a row direction. In a specific embodiment, the first direction X and the second direction Y may be intersected perpendicularly with each other. When the first contact electrodes 31 are re-used as the touch electrode 80, one of the first touch electrode 81 and the second touch electrode 82 may be a transmitting electrode and another may be a receiving electrode.

In a specific embodiment, the patterns of the first touch electrodes 81 and the second touch electrodes 82 may be diamond-shaped patterns.

The micro light emitting diode touch display panel 100 further includes a plurality of first bridge lines 33. The first bridge lines 33 electrically connect adjacent two of the second touch electrodes 82 in the same row. The adjacent two of the first touch electrodes 81 in the same column are electrically connected with each other through the corresponding first contact electrodes 31. The first touch electrodes 81 and the second touch electrodes 82 are disposed on the same layer. The first touch electrodes 81 and the first bridge lines 33 are disposed on different layers.

As shown in FIG. 9, in the touch solution of the mutual capacitance, the first touch electrodes 81 in one column or the second touch electrodes 82 in one row electrically connect the bonding portion 50 through the same one of the power supply voltage signal lines 20. Specifically, the first touch electrodes 81 in one column may be introduced to the bonding portion 50 by one of the power supply voltage signal lines 20 of peripheral one of the first touch electrodes. The second touch electrodes 82 in one row may be introduced to the bonding portion 50 through one of the power supply voltage signal lines 20 of peripheral one of the second touch electrodes 82.

As such, one embodiment of the present disclosure provides a micro light emitting diode touch display panel 100 including a plurality of pixel driving circuits 12, a plurality of power supply voltage signal lines 20, a plurality of first contact electrodes 31, and a plurality of micro light emitting units 40 distributed in an array. The power supply voltage signal lines 20 electrically connect the pixel driving circuits 12 and the first contact electrodes 31. The micro light emitting units 40 are bonded to the first contact electrodes 31 to connect. In the display driving phase, the power supply voltage signal lines 20 transmit power supply voltage signals to the pixel driving circuits 12. In the touch driving phase, the power supply voltage signal lines 20 are re-used as touch signal lines for transmitting touch signals. By this design, the production costs may be reduced, and the production capacity may be enhanced. It can also ensure good touch and display effects.

In above embodiments, the description of each embodiment has its own focus. For parts that are not described in detail in an embodiment, the related description of other embodiments may be referred thereto.

The above is a detailed introduction to a micro light emitting diode touch display panel provided by one embodiment of the present disclosure, and specific examples are used herein to illustrate the principles and implementations of the present disclosure. The description of the abovementioned embodiments is merely for helping the technical solutions and the core concept of the present disclosure being understood. It can be understood that, for those of ordinary skill in the art, modifications or equivalent replacements of the technical solutions in the abovementioned embodiments can be made, and all of these modifications or replacements shall not render the nature of the technical solutions depart from the respective technical solutions in the present disclosure.

What is claimed is:

1. A micro light emitting diode touch display panel, comprising:
    an array substrate comprising a plurality of pixel driving circuits in an array arrangement;
    a plurality of power supply voltage signal lines disposed on the array substrate and electrically connected with the corresponding pixel driving circuits;
    a plurality of first contact electrodes in an array arrangement and a plurality of second contact electrodes in an array arrangement, wherein the second contact electrodes are disposed in the same layer as the first contact electrodes on the power supply voltage signal lines, the first contact electrodes are electrically connected with the corresponding power supply voltage signal lines, and the second contact electrodes are electrically connected with the corresponding pixel driving circuits; and
    a plurality of micro light emitting units in an array arrangement, each of the micro light emitting units comprising a first electrode and a second electrode, wherein the first electrode and the second electrode are disposed in a same layer on the first contact electrodes and the second contact electrodes, the first electrode is bonded and connected to corresponding one of the first contact electrodes, and the second electrode and corresponding one of the second contact electrodes are bonded to connect; wherein
    in a display driving phase of the micro light emitting diode touch display panel, the power supply voltage signal lines transmit power supply voltage signals to the pixel driving circuits;
    in a touch driving phase of the micro light emitting diode touch display panel, the first contact electrodes are re-used as touch electrodes, and the power supply voltage signal lines are re-used as touch signal lines for transmitting touch signals;
    every few of the first contact electrodes is re-used as one of the touch electrodes, the few of the first contact electrodes are distributed along a first direction and a second direction, the first direction intersects with the second direction;
    in one of the touch electrodes, ones of the few of the first contact electrodes arranged in each row along the first direction contact to connect with each other to form a strip electrode, and ones of the few of the first contact electrodes arranged in each column along the second direction are electrically connected to a same one of the power supply voltage signal lines through corresponding first contact holes; and
    in one of the touch electrodes, ones of the power supply voltage signal lines are arranged along the first direction and extend along the second direction, and the ones of the power supply voltage signal lines intersect with the strip electrode to form a metal mesh pattern.

2. The micro light emitting diode touch display panel according to claim 1, wherein the micro light emitting diode touch display panel comprises a display area and a bonding portion located outside the display area, the bonding portion electrically connects a driving chip, the driving chip time-sharing control a display drive and a touch drive of the micro light emitting diode touch display panel, the first contact electrodes are located at the display area, and a part of the power supply voltage signal lines electrically connects to the bonding portion.

3. The micro light emitting diode touch display panel according to claim 2, wherein the micro light emitting diode touch display panel comprises a plurality of scan lines intersecting with a plurality of data lines, the scan lines and the data lines electrically connect with the pixel driving circuits, the micro light emitting diode touch display panel has a drive cycle comprising a first time period and a second time period that are set next to each other in a frame of a display screen;
during the first time period, the driving chip transmits a direct current potential signal to the power supply voltage signal lines, loads scan signals column by column to each of the scan lines, and loads data voltage signals to each row of the data lines;
during the second time period, the driving chip transmits a touch signal to the power supply voltage signal lines, each column of the scan lines and each row of the data lines are in a floating state; wherein the first time period and the second time period do not overlap, and a sum of the first time period and the second time period is equal to a frame of a display cycle.

4. The micro light emitting diode touch display panel according to claim 2, wherein the micro light emitting diode touch display panel comprises a plurality of scan lines intersecting with a plurality of data lines, the scan lines and the data lines electrically connect with the pixel driving circuits, the micro light emitting diode touch display panel comprises at least two first display intervals and at least two first touch intervals in a drive cycle of a frame of a display screen, and the first display intervals and the first touch intervals are alternately set in turn;
in the first display intervals, the driving chip transmits a direct current potential signal to the power supply voltage signal lines, loads scan signals column by column to a part of the scan lines, loads data voltage signals to each row of the data lines;
in the first touch intervals, the driving chip transmits a touch signal to the power supply voltage signal lines, each column of the scan lines and each row of the data lines are in a floating state; wherein the first display intervals and the first touch intervals do not overlap, and a sum of the at least two first display intervals and the at least two first touch intervals is equal to a drive cycle in a frame of a display screen.

5. The micro light emitting diode touch display panel according to claim 2, wherein the power supply voltage signal lines comprise a first power signal line for transmitting a direct current high potential signal in a display phase, and a second power signal line for transmitting a direct current low potential signal in the display phase, wherein at least one of the first power signal line and the second power signal line is re-used as the touch signal line.

6. The micro light emitting diode touch display panel according to claim 5, wherein the second power signal line is re-used as the touch signal line.

7. The micro light emitting diode touch display panel according to claim 6, wherein any adjacent touch electrodes are insulated from each other, at least one of the few of the power supply voltage signal lines which is correspondingly electrically connected with one of the touch electrodes is electrically connected with the bonding portion.

8. The micro light emitting diode touch display panel according to claim 5, wherein the touch electrodes comprise:
a plurality of first touch electrodes distributed in a form of an array, arranged along the first direction and in multiple columns, wherein the first touch electrodes in each column are electrically connected with each other; and
a plurality of second touch electrodes distributed in a form of an array and insulated from the first touch electrodes, arranged along the second direction and in multiple rows, and the second touch electrodes in each row are electrically connected with each other.

9. The micro light emitting diode touch display panel according to claim 8, wherein the micro light emitting diode touch display panel further comprises a plurality of first bridge lines electrically connected with adjacent two of the second touch electrodes in the same row, wherein adjacent two of the first touch electrodes in the same column are electrically connected through the corresponding first contact electrodes; the first touch electrodes and the second touch electrodes are disposed on same layer, and the first touch electrodes and the first bridge lines are disposed on different layers.

10. The micro light emitting diode touch display panel according to claim 9, wherein the first touch electrodes in one column or the second touch electrodes in one row are electrically connected to the bonding portion through the same one of the power supply voltage signal lines.

11. The micro light emitting diode touch display panel according to claim 6, wherein a first insulating layer is disposed between the first contact electrodes and the power supply voltage signal lines, the first insulating layer comprises the first contact holes.

12. The micro light emitting diode touch display panel according to claim 11, wherein a second insulating layer is disposed on the first contact electrodes and the second contact electrodes, the second insulating layer comprises a plurality of second contact holes and a plurality of third contact holes, the first electrodes are electrically connected with the first contact electrodes through the second contact holes, the micro light emitting unit further comprises second electrodes electrically connected with the second contact electrodes through the third contact holes.

13. The micro light emitting diode touch display panel according to claim 12, wherein the second contact electrodes are arranged along the first direction and the second direction, and the second contact electrodes and the first contact electrodes are distributed in a form of alternate columns.

14. A micro light emitting diode touch display panel, comprising:
an array substrate comprising a plurality of pixel driving circuits in an array arrangement;
a plurality of power supply voltage signal lines disposed on the array substrate and electrically connected with the corresponding pixel driving circuits;
a plurality of first contact electrodes in an array arrangement, disposed on the power supply voltage signal lines, and electrically connected with the corresponding power supply voltage signal lines; and
a plurality of micro light emitting units in an array arrangement, the micro light emitting units include first electrodes, wherein the first electrodes and the corresponding first contact electrodes are bonded to connect;
wherein in a display driving phase of the micro light emitting diode touch display panel, the power supply voltage signal lines transmit power supply voltage signals to the pixel driving circuits;

in a touch driving phase of the micro light emitting diode touch display panel, the first contact electrodes are re-used as touch electrodes, and the power supply voltage signal lines are re-used as touch signal lines for transmitting touch signals;

the micro light emitting diode touch display panel comprises a bonding portion located outside a display area, a plurality of scan lines, and a plurality of data lines intersecting with the scan lines, the scan lines and the data lines electrically connect with the pixel driving circuits, the bonding portion electrically connects a driving chip, and the micro light emitting diode touch display panel has a drive cycle comprising a first time period and a second time period that are set next to each other in a frame of a display screen;

during the first time period, the driving chip transmits a direct current potential signal to the power supply voltage signal lines, loads scan signals column by column to each of the scan lines, and loads data voltage signals to each row of the data lines; and during the second time period, the driving chip transmits a touch signal to the power supply voltage signal lines, each column of the scan lines and each row of the data lines are in a floating state; wherein the first time period and the second time period do not overlap, and a sum of the first time period and the second time period is equal to a frame of a display cycle.

15. The micro light emitting diode touch display panel according to claim 14, wherein every few of the first contact electrodes are re-used as one of the touch electrodes, the few of the first contact electrodes are distributed along a first direction and a second direction, the first direction intersects with the second direction; and wherein the first contact electrodes arranged along the first direction contact to connect with each other, and the first contact electrodes arranged along the second direction are electrically connected to same one of the power supply voltage signal lines.

16. The micro light emitting diode touch display panel according to claim 15, wherein the driving chip time-sharing control a display drive and a touch drive of the micro light emitting diode touch display panel, the first contact electrodes are located at the display area, and a part of the power supply voltage signal lines electrically connects to the bonding portion.

17. The micro light emitting diode touch display panel according to claim 16, wherein the power supply voltage signal lines comprise a first power signal line for transmitting a direct current high potential signal in a display phase, and a second power signal line for transmitting a direct current low potential signal in the display phase, wherein at least one of the first power signal line and the second power signal line is re-used as the touch signal line.

18. A micro light emitting diode touch display panel, comprising:

an array substrate comprising a plurality of pixel driving circuits in an array arrangement;

a plurality of power supply voltage signal lines disposed on the array substrate and electrically connected with the corresponding pixel driving circuits;

a plurality of first contact electrodes in an array arrangement, disposed on the power supply voltage signal lines, and electrically connected with the corresponding power supply voltage signal lines; and a plurality of micro light emitting units in an array arrangement, the micro light emitting units include first electrodes, wherein the first electrodes and the corresponding first contact electrodes are bonded to connect; wherein in a display driving phase of the micro light emitting diode touch display panel, the power supply voltage signal lines transmit power supply voltage signals to the pixel driving circuits;

in a touch driving phase of the micro light emitting diode touch display panel, the first contact electrodes are re-used as touch electrodes, and the power supply voltage signal lines are re-used as touch signal lines for transmitting touch signals;

the micro light emitting diode touch display panel comprises a bonding portion located outside a display area, a plurality of scan lines, and a plurality of data lines intersecting with the scan lines, the scan lines and the data lines electrically connect with the pixel driving circuits, the bonding portion electrically connects a driving chip, the micro light emitting diode touch display panel comprises at least two first display intervals and at least two first touch intervals in a drive cycle of a frame of a display screen, and the first display intervals and the first touch intervals are alternately set in turn;

in the first display intervals, the driving chip transmits a direct current potential signal to the power supply voltage signal lines, loads scan signals column by column to a part of the scan lines, loads data voltage signals to each row of the data lines;

in the first touch intervals, the driving chip transmits a touch signal to the power supply voltage signal lines, each column of the scan lines and each row of the data lines are in a floating state; wherein the first display intervals and the first touch intervals do not overlap, and a sum of the at least two first display intervals and the at least two first touch intervals is equal to a drive cycle in a frame of a display screen.

19. The micro light emitting diode touch display panel according to claim 18, wherein every few of the first contact electrodes are re-used as one of the touch electrodes, the few of the first contact electrodes are distributed along a first direction and a second direction, the first direction intersects with the second direction; and wherein the first contact electrodes arranged along the first direction contact to connect with each other, and the first contact electrodes arranged along the second direction are electrically connected to same one of the power supply voltage signal lines.

20. The micro light emitting diode touch display panel according to claim 19, wherein the driving chip time-sharing control a display drive and a touch drive of the micro light emitting diode touch display panel, the first contact electrodes are located at the display area, and a part of the power supply voltage signal lines electrically connects to the bonding portion.

* * * * *